(12) United States Patent
Cheng et al.

(10) Patent No.: US 12,400,928 B2
(45) Date of Patent: *Aug. 26, 2025

(54) HEAT DISSIPATION STRUCTURES

(71) Applicant: Taiwan Semiconductor Manufacturing Co., Ltd., Hsinchu (TW)

(72) Inventors: Yun-Wei Cheng, Taipei (TW);
Chun-Hao Chou, Tainan (TW);
Kuo-Cheng Lee, Tainan (TW);
Ying-Hao Chen, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/739,882

(22) Filed: Jun. 11, 2024

(65) Prior Publication Data
US 2024/0332115 A1 Oct. 3, 2024

Related U.S. Application Data

(63) Continuation of application No. 18/136,500, filed on Apr. 19, 2023, now Pat. No. 12,046,528, which is a
(Continued)

(51) Int. Cl.
*H01L 23/367* (2006.01)
*H01L 23/48* (2006.01)
*H01L 25/065* (2023.01)

(52) U.S. Cl.
CPC .......... *H01L 23/367* (2013.01); *H01L 23/481* (2013.01); *H01L 25/0657* (2013.01)

(58) Field of Classification Search
CPC . H01L 23/367; H01L 23/481; H01L 25/0657; H01L 25/18; H01L 2225/06541; H01L 2225/06589; H01L 23/49838
(Continued)

(56) References Cited

U.S. PATENT DOCUMENTS 8,872,330 B2   10/2014   Herrmann et al.
9,390,997 B2   7/2016   Kim et al.
(Continued)

FOREIGN PATENT DOCUMENTS

CN   102097399 A   6/2011
CN   106960835 A   7/2017
(Continued)

OTHER PUBLICATIONS

U.S. Appl. No. 18/136,500, filed Apr. 19, 2023, Cheng et al..
Office Action, dated Oct. 19, 2020, for Korean Intellectual Property Office Appl. No. 10-2019-0137939, 7 pages.

*Primary Examiner* — Caleen O Sullivan
(74) *Attorney, Agent, or Firm* — Sterne, Kessler, Goldstein & Fox P.L.L.C.

(57) ABSTRACT

The present disclosure describes heat dissipation structures formed in functional or non-functional areas of a three-dimensional chip structure. These heat dissipation structures are configured to route the heat generated within the three-dimensional chip structure to designated areas on or outside the three-dimensional chip structure. For example, the three-dimensional chip structure can include a plurality of chips vertically stacked on a substrate, a first passivation layer interposed between a first chip and a second chip of the plurality of chips, and a heat dissipation layer embedded in the first passivation layer and configured to allow conductive structures to pass through.

20 Claims, 7 Drawing Sheets

Related U.S. Application Data continuation of application No. 17/107,312, filed on Nov. 30, 2020, now Pat. No. 11,670,562, which is a continuation of application No. 16/528,207, filed on Jul. 31, 2019, now Pat. No. 10,854,530.

(58) Field of Classification Search
USPC .......................................................... 257/713
See application file for complete search history.

(56) References Cited

U.S. PATENT DOCUMENTS

| | | | |
|---|---|---|---|
| 10,854,530 B1 | 12/2020 | Cheng et al. | |
| 11,670,562 B2 | 6/2023 | Cheng et al. | |
| 12,046,520 B2 * | 7/2024 | Cao | G01K 3/10 |
| 2009/0273068 A1 | 11/2009 | Kaskoun et al. | |
| 2010/0038802 A1 | 2/2010 | Chen et al. | |
| 2010/0187670 A1 | 7/2010 | Lin et al. | |
| 2012/0248627 A1 | 10/2012 | Gaul et al. | |
| 2013/0326873 A1 | 12/2013 | Huang et al. | |
| 2015/0050778 A1 | 2/2015 | Asahi et al. | |
| 2017/0104019 A1 | 4/2017 | Jung | |
| 2017/0200756 A1 | 7/2017 | Kao et al. | |
| 2017/0294422 A1 | 10/2017 | Solimando et al. | |
| 2018/0047707 A1 | 2/2018 | Or-Bach et al. | |
| 2021/0082784 A1 | 3/2021 | Cheng et al. | |

FOREIGN PATENT DOCUMENTS

| | | |
|---|---|---|
| JP | 2009188400 A | 8/2009 |
| JP | 2011243689 A | 12/2011 |
| JP | 2018006507 A | 1/2018 |
| KR | 20150005199 A | 1/2015 |
| KR | 20170042940 A | 4/2017 |
| TW | 200816524 A | 4/2008 |
| TW | 201034155 A | 9/2010 |
| TW | 201737437 A | 4/2018 |
| TW | 201814861 A | 4/2018 |

\* cited by examiner

600

```
┌─────────────────────────────────────────────┐
│ Disposing, on a substrate, a first chip with a first │
│ heat dissipation layer connected to a first heat    │──── 610
│           dissipation structure             │
└─────────────────────────────────────────────┘
                      │
                      ▼
┌─────────────────────────────────────────────┐
│ Disposing, on the first chip, a second chip with a  │
│ second heat dissipation layer and a second heat     │
│ dissipation structure, where the first heat dissipation │──── 620
│ structure connects the first heat dissipation layer to │
│ the second heat dissipation layer and the second    │
│             heat dissipation structure              │
└─────────────────────────────────────────────┘
                      │
                      ▼
┌─────────────────────────────────────────────┐
│ Disposing, on the second chip, a third chip with a  │
│ third heat dissipation layer connected to a third heat │
│ dissipation structure, where the third heat         │──── 630
│ dissipation layer is connected via heat dissipation │
│ bonding structures to the second heat dissipation   │
│                    structure                        │
└─────────────────────────────────────────────┘
                      │
                      ▼
┌─────────────────────────────────────────────┐
│ Disposing a heat sink on the third chip to connect  │──── 640
│ the heat sink to the third heat dissipation structure │
└─────────────────────────────────────────────┘
```

FIG. 6

HEAT DISSIPATION STRUCTURES

CROSS-REFERENCE TO RELATED APPLICATION

This application is a continuation of U.S. patent application Ser. No. 18/136,500, titled "Heat Dissipation Structures," filed Apr. 19, 2023, which is a continuation of U.S. patent application Ser. No. 17/107,312, titled "Heat Dissipation Structures," filed Nov. 30, 2020, which is a continuation of U.S. patent application Ser. No. 16/528,207, titled "Heat Dissipation Structures," filed Jul. 31, 2019, each of which is incorporated herein by reference in its entirety.

BACKGROUND

Three-dimensional system on integrated chip structures with increased chip density can have high heat density and poor thermal dissipation performance compared to their two-dimensional counterparts. Increased heat density in three-dimensional system on integrated chip structures can lead to electromigration and reliability issues.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 6 is a flow chart of a method describing a formation of a stacking device with a heat dissipation network, according to some embodiments.

DETAILED DESCRIPTION

Figure 1:
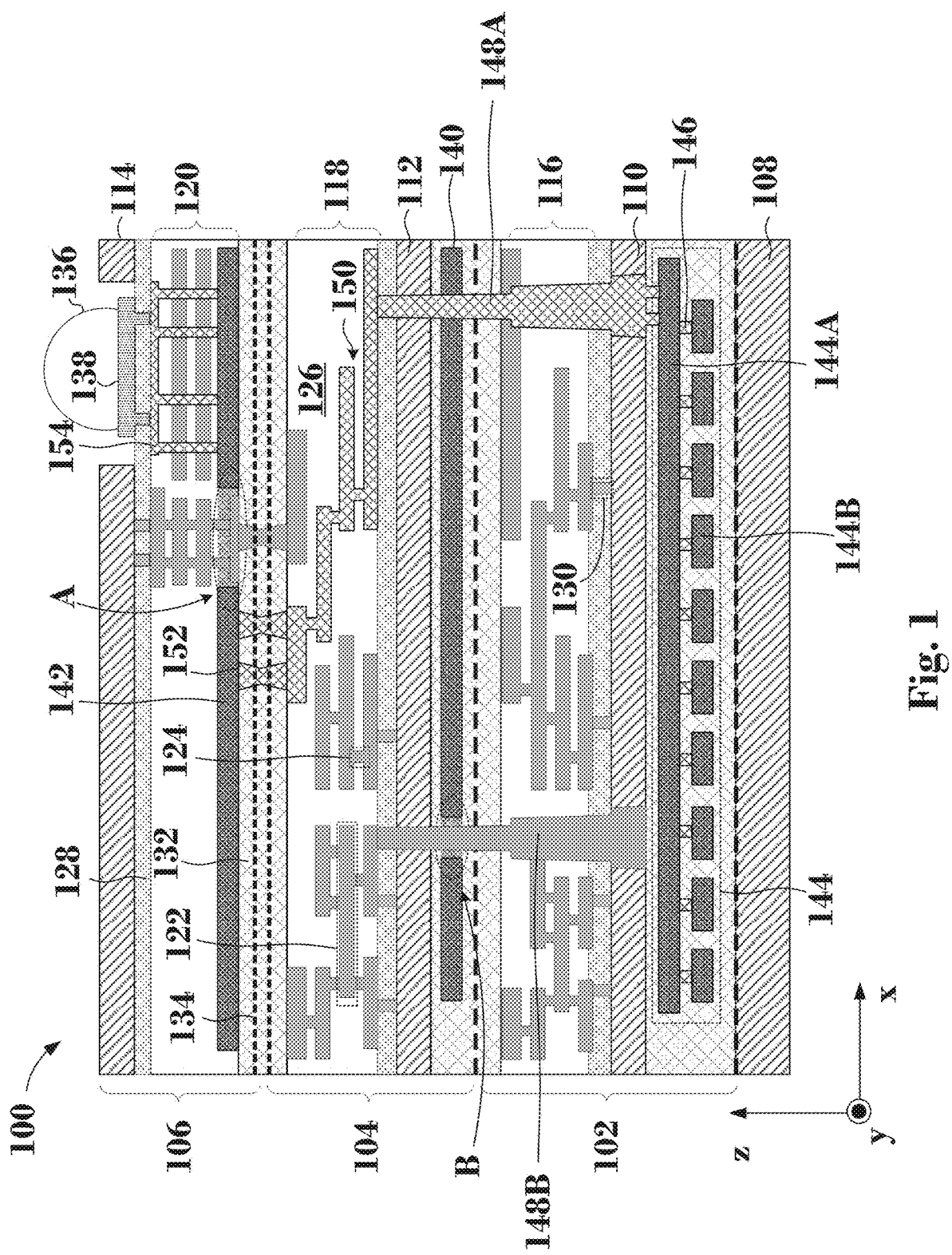
FIG. 1 is a cross-sectional view of a stacking device with a heat dissipation network, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate.

In some embodiments, the terms "about" and "substantially" can indicate a value of a given quantity that varies within 5% of the value (e.g., ±1%, ±2%, ±3%, ±4%, ±5% of the value).

A three-dimensional (3D) system on integrated chip ("3D SoIC") structure is a non-monolithic vertical structure that includes at least two chips stacked vertically on top of each other. Different types of chips, performing different functions, can be stacked in the 3D SoIC structure. For example, the 3D SoIC structure can include logic chips, memory chips, radio frequency (RF) chips, etc. By way of example and not limitation, the logic chips can include central process units (CPUs), and the memory chips can include static-access memory (SRAM) arrays, dynamic random-access memory (DRAM) arrays, magnetic random-access memory (MRAM) arrays, resistive random-access memory (RRAM) arrays, or other types of memory arrays. In the 3D SoIC structure, the chips in the stack can be electrically and mechanically coupled together through conductive structures, such as microbump structures, through silicon via (TSV) structures, through oxide via (TOV) structures, different types of bonding structures (e.g., homogeneous or hybrid), etc. The aforementioned conductive structures can be, for example, shorter than the interconnect structures used in 2D SoIC structures, where two or more chips are arranged laterally as opposed to vertically. For this reason, 3D SoIC structures, as opposed to their 2D counterparts, are faster, denser, and have increased functionality. Further, the 3D SoIC structures have a smaller footprint (e.g., are more compact) compared to 2D SoIC structures.

Since 3D SoIC structures have an increased chip density and a reduced footprint, they also have a higher heat density per unit area and are therefore more susceptible to heat dissipation issues compared to 2D SoIC structures. The increased heat density in 3D SoIC structures can lead, for example, to electromigration—which increases the resistance of conductive structures within the chips, deteriorate the performance of the chips, and reduces the lifetime of the 3D SoIC structures. Reliability concerns also arise from the chips in the 3D SoIC stack generating different amounts of heat during operation; therefore, some areas are at a higher temperature than other areas of the 3D SoIC structure. This temperature gradient can induce thermo-mechanical stress within the 3D SoIC structure and lead to fractured layers in the chips.

To address the above shortcomings, embodiments described herein are directed to heat dissipation structures formed in functional and/or non-functional areas of 3D SoIC structures. These heat dissipation structures efficiently route the heat generated within the 3D SoIC structure to designated areas on the 3D SoIC structure or outside the 3D SoIC structure. In some embodiments, the heat dissipation structures can include (i) heat dissipation layers that extend laterally within a chip in the 3D SoIC structure, (ii) vertical or lateral thermally conductive structures disposed within metallization layers of chip's in the 3D SoIC structure, (iii) vertical thermally conductive structures disposed between two or more chips in the 3D SoIC structure, and/or (iv) combinations thereof. In some embodiments, the heat dissipation layers can include more than one layers embedded in a dielectric material, such as a passivation layer. The heat dissipation layers can include a material with a thermal conductivity greater than about 1 W/mK, such as a metal or a metal alloy. Further, the heat dissipation structures can be configured to route heat from different areas of the 3D SoIC structure (e.g., between chips or within chips) to a designated heat dissipation location, such as a heat sink disposed either on the 3D SoIC structure or outside the 3D SoIC structure.

FIG. 1 is a cross-sectional view of a stacking device 100, according to some embodiments. By way of example and not limitation, stacking device 100 is a 3D SoIC structure. By way of example and not limitation, stacking device 100 can include three of more chips, which are vertically stacked on top of each other (e.g., vertically). In the example of FIG. 1, stacking device 100 includes chip 102, chip 104, and chip 106. Each or all of chips 102, 104, and 106 can be a central processing unit (CPU), a graphics processing unit, memory, an application specific integrated circuit (ASIC), or any other type of processing device. In some embodiments, chips 102, 104, and 106 are different from one another. For example, chips 102, 104, and 106 may be configured to perform different functions for stacking device 100. In some embodiments, chips 102, 104, and 106 are configured to perform the same functions. Stacking device 100 also includes a carrier substrate 108, which provides structural support to stacking device 100.

In some embodiments, chips 102, 104, and 106 are formed on separate substrates and are subsequently mechanically and electrically bonded together to form stacking device 100. For example, chip 102 is formed on substrate 110, chip 104 is formed on substrate 112, and chip 106 is formed on substrate 114. According to some embodiments, each one of substrates 110, 112, and 114 can be a bulk semiconductor wafer (e.g., a silicon wafer), or a semiconductor-on-insulator wafers (e.g., silicon-on-insulator, SOI). For example, substrate 110 and 112 can be SOI wafers and substrate 114 can be a silicon wafer. In some embodiments, substrates 110, 112, and 114 can include (i) silicon, (ii) a compound semiconductor such as gallium arsenide (GaAs), gallium phosphide (GaP), indium phosphide (InP), indium arsenide (InAs), and/or indium antimonide (InSb), silicon germanium (SiGe), (iii) an alloy semiconductor including, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof.

In some embodiments, substrates 110, 112, and 114 are thinned (e.g., mechanically grinded and polished)—prior to bonding chips 102, 104, and 106 together—to reduce the height of stacking device 100 and to facilitate the formation of electrically conductive structures that electrically connect the chips within stacking device 100. In some embodiments, substrates 110, 112, and 114 are not thinned prior to bonding chips 102, 104, and 106 together. By way of example and not limitation, chips 102, 104, and 106 are aligned based on alignment marks (not shown) and subsequently bonded to bonding layers (passivation layers) and structures that mechanically secure and electrically connect the chips together. Bonding layers can include, for example, passivation layers with plasma-treated or chemically-treated surfaces and bonding structures with hybrid bonding structures (e.g., metal structures on adjoining surfaces inlaid in a dielectric material).

In the example of FIG. 1, chips 102 and 104 in stacking device 100 have the same vertical orientation, while chip 106 is oriented upside down (e.g., oriented 180° with respect to chips 102 and 104). The orientation for each chip is not limiting and different orientations are possible. These other orientations are within the spirit and the scope of this disclosure.

In some embodiments, each chip 102, 104, and 106 includes one or more multilevel metallization layers. For example, chip 102 includes a multilevel metallization layer 116, chip 104 includes a multilevel metallization layer 118, and chip 106 includes a multilevel metallization layer 120. By way of example and not limitation, these multilevel metallization layers can include back-end-of-the-line (BEOL) wiring layers. Each of multilevel metallization layers 116, 118, and 120 can further include a network of lateral and vertical electrically conductive structures 122 and 124 (shaded gray in FIG. 1 and in subsequent figures) that propagate electrical signals across each chip. Lateral and vertical electrically conductive structures 122 and 124 in each multilevel metallization layer are embedded in a dielectric layer 126. In some embodiments, dielectric layer 126 is a low-k dielectric (e.g., with a dielectric constant lower than 3.9) or a stack of dielectrics, such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide. By way of example and not limitation, dielectric layer 126 can be deposited by a high-density chemical vapor deposition (HDCVD) process, a plasma-enhanced chemical vapor deposition process (PECVD), a plasma-enhanced atomic layer deposition process (PEALD), or any other suitable deposition method.

In some embodiments, chips 102, 104, and 106 include additional elements or components not shown in FIG. 1 for simplicity. By way of example and not limitation, chips 102, 104, and 106 can include semiconductor devices (e.g., transistors), capacitors, resistors, or memory structures not shown in FIG. 1 for simplicity.

In some embodiments, an interlayer dielectric 128 is disposed between the multilevel metallization layer of a chip and the chip's substrate. By way of example and not limitation, interlayer dielectric 128, can provide electrical isolation to components formed on or at the vicinity of the chip's substrate, such as semiconductor devices (e.g., transistors), capacitors, resistors—which are not shown in FIG. 1 for simplicity. In some embodiments, interlayer dielectric 128 includes a network of vertical electrically conductive structures 130 (shaded gray in FIG. 1 and in subsequent figures) such as middle-of-the-line (MOL) wiring contacts that electrically connect the aforementioned semiconductor devices, capacitors, and resistors to respective electrically conductive multilevel metallization layers.

In some embodiments, the chips in stacking device 100 of FIG. 1 are mechanically bonded together via passivation layers 132. For this reason, passivation layers 132 can be formed on a top surface of the chip's multilevel metallization layer and/or on a surface of the chip's substrate that is opposite to the multilevel metallization layer. For example, as two chips are stacked together, the passivation layer of the first chip is attached and mechanically bonded to the passivation layer of the second chip. As a result, an interface 134, represented by a dotted line, is formed between the two bonded passivation layers. By way of example and not limitation, chip 104, which is attached to both chips 102 and 106, features two passivation layers 132—one on multilevel metallization layer 118 and another on substrate 112. Similarly, chip 102, which is attached to both chip 104 and carrier substrate 108, also features two passivation layers 132. Since chip 106 is only attached to chip 104, it includes a single passivation layer 132 disposed on a top surface of its multilevel metallization layer 120.

In some embodiments, passivation layers 132 include a dielectric layer, such as silicon oxide, silicon oxy-nitride, or silicon carbide that can be grown on an exposed surface of the chip's substrate or on the chip's multilevel metallization layer.

In some embodiments, stacking device 100 is electrically and mechanically coupled to external electronic components, such as circuitry boards and heat sinks, through a series of ball grid array (BGA) connectors. The BGA connectors include, for example, solder bumps connectors-like solder bump connector 136 shown in FIG. 1. In some embodiments, solder bump connector 136 is internally connected to multilevel metallization layer 120 of chip 106 via an under bump metallurgy (UBM) structure 138 (e.g., a pad structure).

According to some embodiments, stacking device 100 further includes a heat dissipation network consisting of heat dissipation layers and thermally conductive structures-which are represented with a cross hatched pattern in FIG. 1 and in subsequent figures. The heat dissipation layers and thermally conductive structures are configured to route heat generated within chips 102, 104, and 106 to an external heat sink, which is not shown in FIG. 1 for simplicity. In some embodiments, the thermally conductive structures of the heat dissipation network, which are represented with a cross hatched pattern in FIG. 1 and in subsequent figures, are similar in terms of shape and size to corresponding electrically conductive structures, which are shaded gray in FIG. 1 and in subsequent figures and are used for electrical signal propagation in stacking device 100. In some embodiments, the difference between the thermally conductive structures of the heat dissipation network, represented with a cross hatched pattern in FIG. 1 and in subsequent figures, and the electrically conductive structures, shaded gray in FIG. 1 and in subsequent figures, is their function. The thermally conductive structures are used for heat dissipation and the electrically conductive structures are used for electrical signal propagation. For example, thermally conductive TOV and/or TSV 148A represented with a cross hatched pattern is similar to an electrically conductive TOV and/or TSV 148B shaded gray but has a different function. Thermally conductive TOV and/or TSV 148A dissipates heat, while electrically conductive TOV and/or TSV 148B propagates electrical signals.

In some embodiments, the heat dissipation network includes single or multilayer heat dissipation layers connected to: (i) multilevel thermally conductive structures disposed within the chips' multilevel metallization layers (e.g., multilevel thermally conductive structures 150 and 154 disposed in multilevel metallization layers 118 and 120 respectively), (ii) vertical thermally conductive structures disposed between pairs of adjacent chips (e.g., bonding structures 152), (iii) vertical thermally conductive structures disposed between two or more chips (e.g., thermally conductive TOV and/or TSV 148A), or (iii) combinations thereof. All thermally conductive structures that are part of the heat dissipation network in stacking device 100 are represented with a cross hatched pattern in FIG. 1 and in subsequent figures, while the electrically conductive structures used for electrical signal propagation in stacking device 100 are shaded gray in FIG. 1 and in subsequent figures. Further, the structures in heat dissipation network are electrically isolated from the electrically conductive structures used for electrical signal propagation.

In some embodiments, the term "thermally conductive" refers to the property of a material to conduct and transfer heat (e.g., allow the heat to flow) from one area of the chip to another. In some embodiments, a thermally conductive material is also an electrically conductive material. For this reason, the thermally conductive structures of the heat dissipation network are electrically isolated from electrically conductive structures used for electrical signal propagation. Materials that can efficiently conduct heat (e.g., have sufficient thermal conductivity) are desirable as thermally conductive materials. In some embodiments, materials with a thermal conductivity greater than about $1~W~m^{-1}~K^{-1}$ (e.g., about $200~W~m^{-1}~K^{-1}$), such as metals or metal alloys, can be used to form the thermally conductive structures of the heat dissipation network.

In some embodiments, a heat dissipation layer can be an "isolated" layer embedded in a chip's passivation layer (e.g., in a non-functional area of the chip) or it can be integrated (e.g., part of) into a chip's multilevel metallization layer (e.g., in a functional area of the chip). The term "isolated" as used herein refers to a structure or layer that is not integrated with—e.g., part of—another structure, such as a multilevel metallization layer, and it is disposed in a non-functional area of the chip. By way of example and not limitation, heat dissipation layer 140, shown in FIG. 1, is an isolated thermally conductive layer that extends parallel to the x-y plane and is embedded in passivation layer 132 of chip 104. In some embodiments, heat dissipation layers embedded in passivation layers, such as heat dissipation layer 140, are disposed on a side of the chip's substrate that is opposite to the chip's multilevel metallization layer. On the other hand, heat dissipation layer 142 is a thermally conductive layer parallel to the x-y plane and located into a layer of multilevel metallization layer 120 of chip 106. In other words, heat dissipation layer 142 can be formed in a functional area of the chip and "incorporated" in a metallization layer of multilevel metallization layer 120. In some embodiments, heat dissipation layer 142 is in direct contact with multilevel thermally conductive structure 154. However, as discussed above, heat dissipation layer 142 and multilevel thermally conductive structure 154 are electrically isolated from the metallization layers of multilevel metallization layer 120.

Heat dissipation layers 140 and 142 can include openings to allow conductive structures between adjacent chips and/or within the chip to traverse through the heat dissipation layer without coming in physical contact with the heat dissipation layer. In some embodiments, this means that heat dissipation layers 140 and 142 can conform to the chip's layout so that the heat dissipation layer does not obstruct electrically conductive structures extending from one chip to another or within the chip. For example, in referring to FIG. 1, heat dissipation layer 142 of chip 106 can include an opening A that allows electrically conductive structures from multi-level metallization layer 120 to traverse through it. Heat dissipation layer 142 may include additional openings like opening A at different locations to facilitate the passage of electrically conductive structures from multilevel metallization layer 120. Similarly, heat dissipation layer 140 can include one or more openings B that allow respective electrically conductive TOV and/or TSV 148B shaded gray in FIG. 1 to traverse through heat dissipation layer 140. In some embodiments, openings A and B are sufficiently large to prevent the electrically conductive structures from coming into physical contact with the surrounding heat dissipation layers. For example, openings A and B can be formed around the conductive structures and be arranged according to the chip's layout.

Figure 2A:
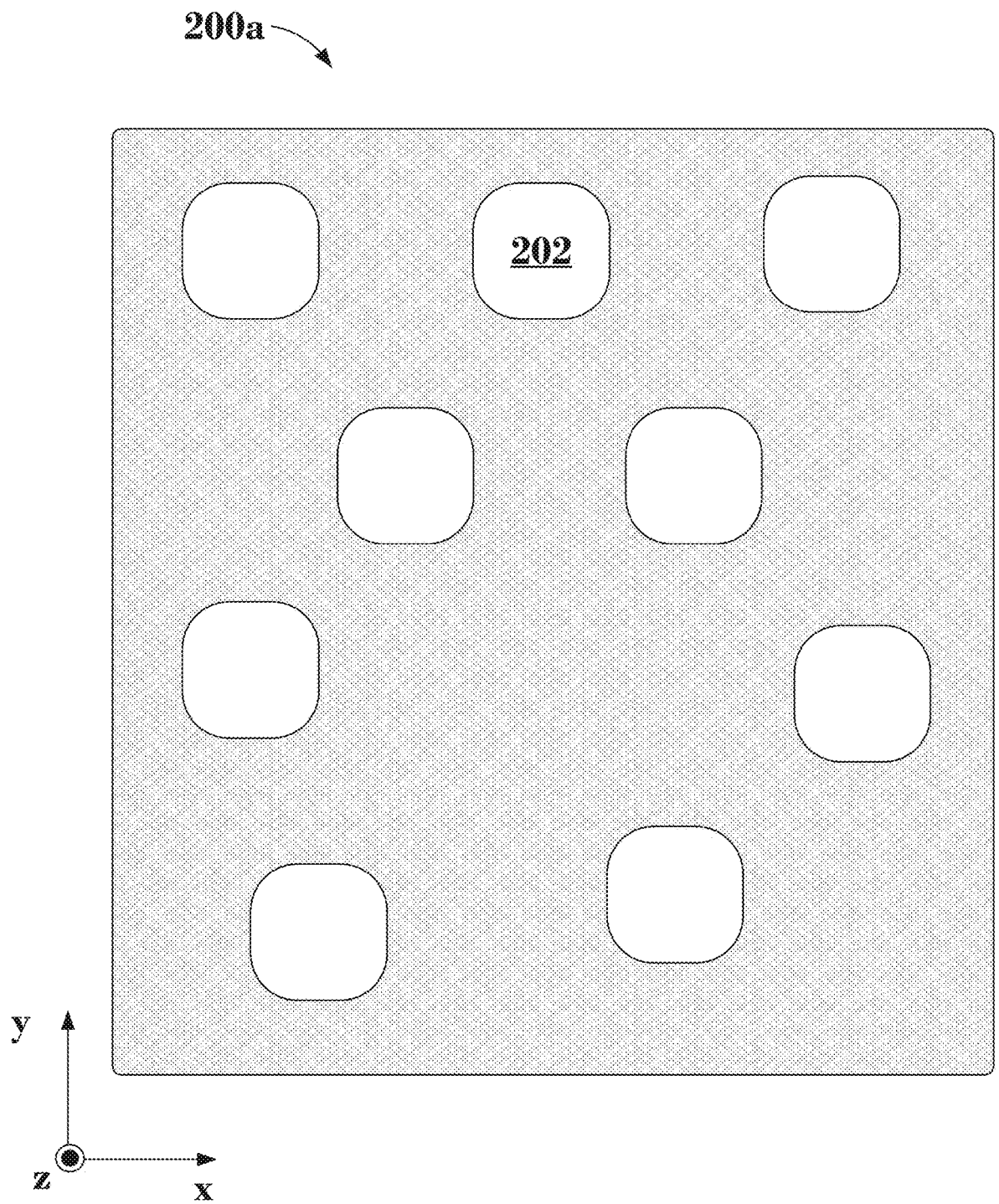
FIGS. 2A and 2B are plan views of respective heat dissipation layers with openings, according to some embodiments.
Figure 2B:
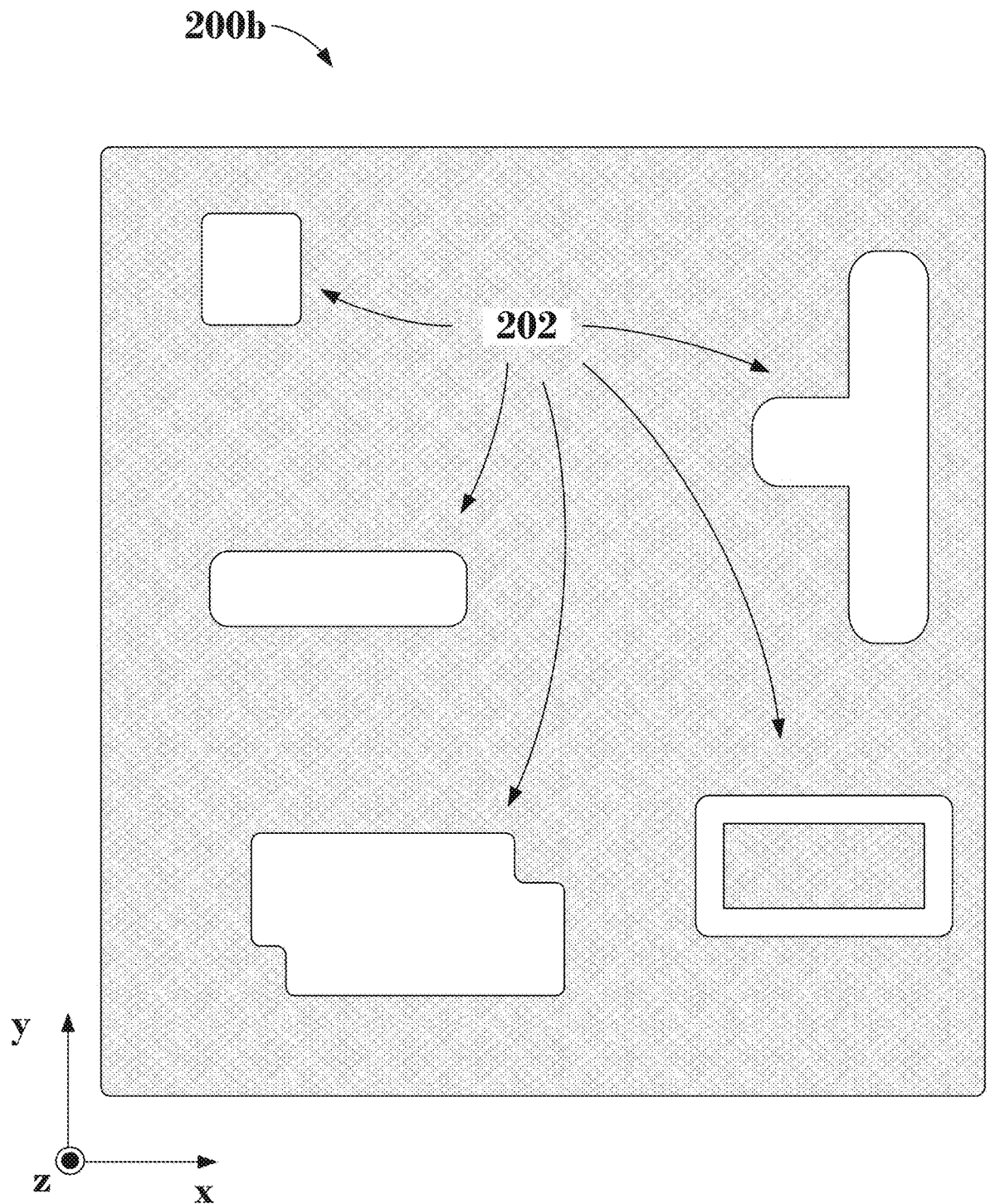

In some embodiments, due to the presence of openings A and B, heat dissipation layers 140 and 142 have a "mesh-type" appearance. By way of example and not limitation, FIGS. 2A and 2B are plan views of exemplary "mesh-type" heat dissipation layers 200b and 200b with respective openings 202—which, according to some embodiments, are similar to openings A and B of heat dissipation layers 142 and 140 shown in FIG. 1. In some embodiments, the arrangement, size, shape, and number of openings 202 can vary depending on the chip's layout (e.g., the location, the density, and the arrangement of the chip's elements and structures in the x-y plane). According to some embodiments, the total surface area of heat dissipation layers 200a and 200b is equal to or greater than 50% of the chip's surface area to ensure that the surface area of the heat dissipation layer is sufficiently large to cool the chip and prevent overheating. In some embodiments, each opening 202 can have a different shape and/or size to accommodate the chip's layout and ensure that the conductive structures passing through the heat dissipation layer are not touching the heat dissipation layer.

According to some embodiments, openings 202 in mesh-type heat dissipation layers 200a and 200b shown in FIGS. 2A and 2B serve two purposes: i) allow other structures (e.g., electrically conductive structures for electrical signal propagation) to pass through heat dissipation layers 200a and 200b without coming in physical contact with the heat dissipation layer, and/or ii) mitigate dishing from a planarization process (e.g., a chemical mechanical polishing (CMP) process) during the formation of heat dissipation layers 200a and 200b. Dishing may occur because areas with low density of openings tend to polish faster compared to areas with high density of openings. Therefore, dishing can cause thickness non-uniformity across the heat dissipation layer, which can adversely impact its heat dissipation performance. For example, thinner areas of heat dissipation layers 200a and 200b can have limited heat transfer capability compared to thicker areas of heat dissipation layers 200 and 200b, much like a wire with a small cross section (e.g., a thin wire) can have a high electrical resistance and a small current carrying ability compared to a wire with a large cross section (e.g., a thick wire). Therefore, thickness non-uniformity in heat dissipation layers 200a and 200b can impair the uniform flow of heat from the chip and create hot spots. Therefore, placement of openings across the heat dissipation layer can minimize the effects of dishing. For this reason, in some embodiments, openings may be formed even at locations where there is no need for an electrically conductive structure to pass through.

The layout, the size, the shape, and the number of openings 202 in mesh-type heat dissipation layers 200a and 200b can be tailored to facilitate the formation of additional structures in the chip. This can be beneficial when heat dissipation layers 200a and 200b are integrated with the chip's multilevel metallization layer, like in the case of heat dissipation layer 142 of chip 106 shown in FIG. 1. In some embodiments, this design flexibility of the mesh-type heat dissipation layer allows its seamless integration with one or more levels of the multilevel metallization layer. By way of example and not limitation, and referring to FIG. 1, heat dissipation layer 142 can be formed concurrently with the first, second, third, or $n^{th}$ layer (e.g., a top metal layer) of multilevel metallization layer 120. In some embodiments, heat dissipation layer 142 can be formed in any combination of layers concurrently within multilevel metallization layer 120 to achieve a surface area coverage equal to or greater than 50% of the chip's area.

In some embodiments, heat dissipation layers 140 and 142 have a thickness that ranges from about 10 nm to about 1 μm. Thicker heat dissipation layers (e.g., thicker than about 1 μm) are possible. However, thicker heat dissipation layers may require thicker passivation layers, which increase the fabrication cost and the overall height of stacking device 100. Accordingly, thinner heat dissipation layers (e.g., thinner than about 10 nm) are also possible. However, thinner heat dissipation layers exhibit a limited heat transfer capacity, which can pose limitations to the heat dissipation process. For example, a thin heat dissipation layer may be unable to transfer heat at a satisfactory rate.

Figure 3:
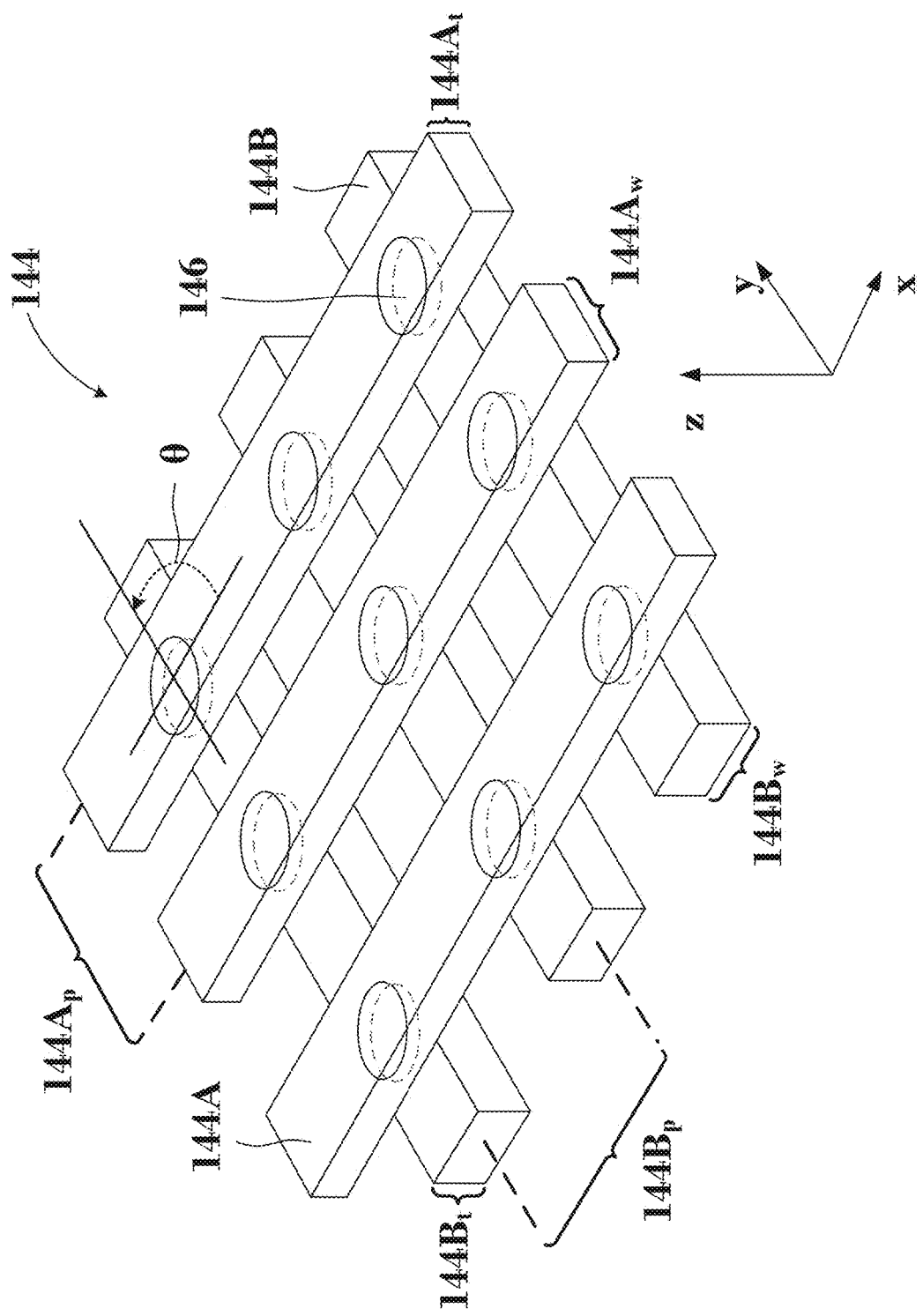
FIG. 3 is an isometric view of a heat dissipation layer with stacked heat dissipation stripes, according to some embodiments.

In some embodiments, heat dissipation layer 200 can be a "stripe-type" heat dissipation layer 144 shown in FIG. 1. In some embodiments, the "stripe-type" heat dissipation layer 144 is a bilayer structure formed by disposing a first array of heat dissipation "stripes" oriented along a first direction on a second array of heat dissipation "stripes" oriented along a second direction different from the first direction. The first and second arrays of heat dissipation stripes can be separated by thermally conductive structures 146. According to some embodiments, FIG. 3 is an isometric view of a portion of stripe-type heat dissipation layer 144. As shown in FIG. 3, stripe-type heat dissipation layer 144 includes two arrays of heat dissipation stripes that are vertically stacked (e.g., along the z-axis). For example, an array of heat dissipation stripes 144A is oriented along the x-axis and is disposed on an array of heat dissipation stripes 144B that is respectively oriented along the y-axis. In some embodiments, heat dissipation stripes 144A and 144B are oriented so that an angle θ is formed between their respective orientations. In some embodiments, angle θ can be between about 0° and about 180° (e.g., about 10°, about 25°, about 45°, about 60°, about 75°, about) 90°. By way of example and not limitation, angle θ in FIGS. 1 and 3 is about 90°.

Figure 4:
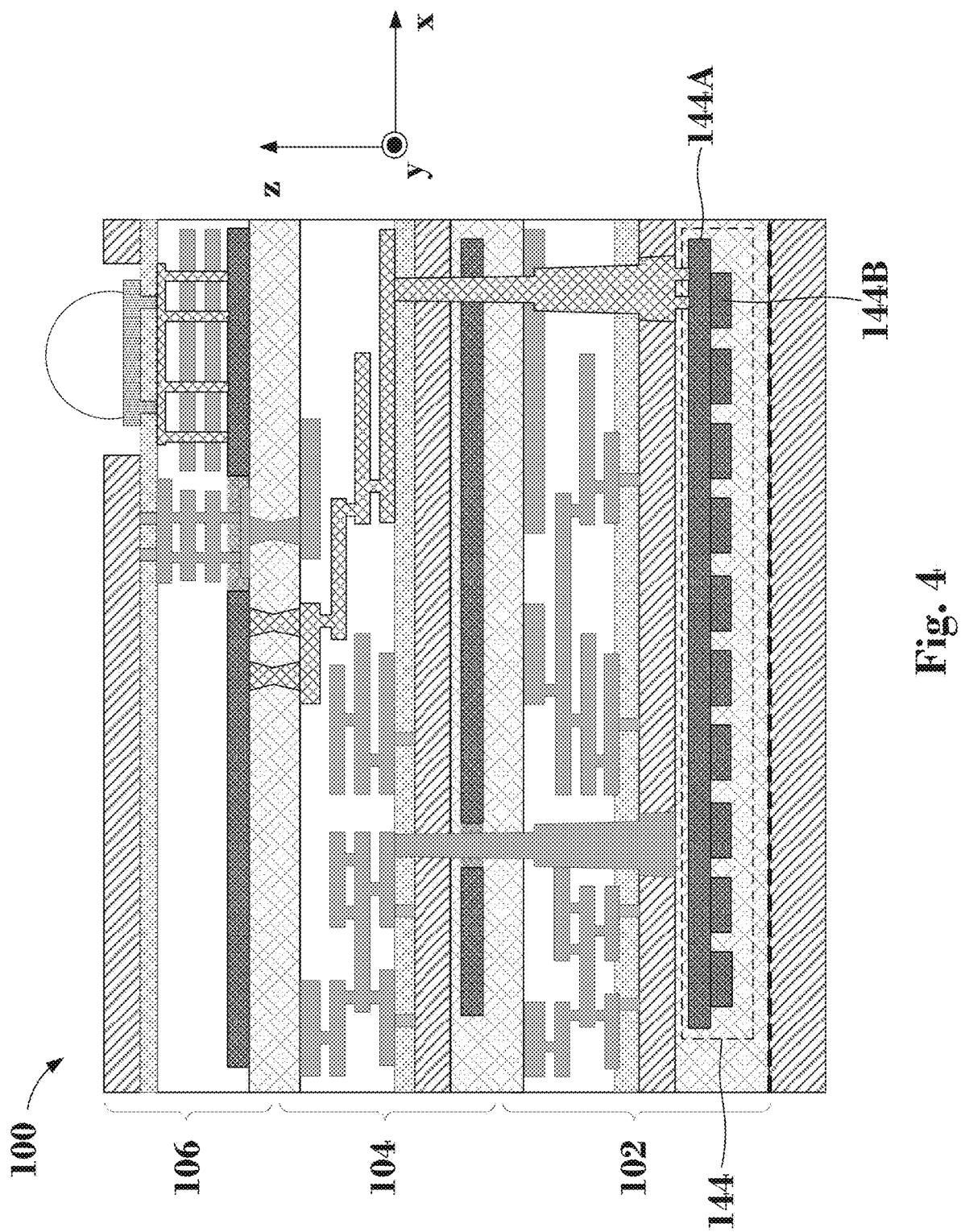
FIG. 4 is a cross-sectional view of stacking device with a heat dissipation network, according to some embodiments.

Heat dissipation stripes 144A and 144B are vertically separated by thermally conductive structures 146. Thermally conductive structures 146 allow the heat generated by chip 102 (e.g., shown in FIG. 1) to flow between heat dissipation stripes 144A and 144B and within stripe-type heat dissipation layer 144. The number, size, pitch, and shape of thermally conductive structures 146 shown in FIG. 3 are not limiting. Therefore, fewer or additional thermally conductive structures 146 are possible with a different pitch, shape, and size. In some embodiments, heat dissipation stripes 144A and 144B can be formed so that thermally conductive structures 146 are not required. For example, heat dissipation stripes 144A can be formed directly on heat dissipation stripes 144B without a vertical separation, as shown in FIG. 4. In some embodiments, the separation between heat dissipation stripes 144A and 144B in stripe-type heat dissipation layer 144 ranges from 0 to about 500 nm (e.g., about 0 nm, about 50 nm, about 150 nm, about 300 nm, about 450 nm, about 500 nm).

Referring to FIG. 3, heat dissipation stripes 144A and 144B have respective thicknesses $144A_t$ and $144B_t$ that can range from about 10 nm to about 1 µm (e.g., from about 10 nm to about 100 nm, from about 50 nm to about 200 nm, from about 100 nm to about 500 nm, from about 400 nm to about 800 nm, from about 700 nm to about 1 µm) and respective widths $144A_w$ and $144B_w$ that range from about 30 nm to about 3 µm. Further, heat dissipation stripes 144A and 144B have respective pitch $144A_p$ and $144B_p$, where each pitch $144A_p$ and $144B_p$ can range from about 100 nm to about 10 µm. In some embodiments, the chip's layout, the width of the heat dissipation stripes, the capability of a planarization process to limit dishing, and the desired footprint (e.g., total area) of the resulting heat dissipation layer 144 are contributing factors that determine the values for pitch $144A_p$ and $144B_p$. In some embodiments, heat dissipation layer 144 is required to cover an area that is equal to or greater than about 50% of the total area of chip 102. Thicker or wider heat dissipation stripes (e.g., thicker than about 1 µm and wider than about 3 µm) are possible. However, thicker and wider heat dissipation stripes require thicker passivation layers, which increase the fabrication cost and the overall height of stacking device 100. Further, wider heat dissipation stripes reduce the pitch between the heat dissipation stripes and can lead to dishing, as discussed above. Accordingly, thinner or narrower heat dissipation stripes (e.g., thinner than 10 nm and narrower than 30 nm) are also possible. However, thinner and narrower heat dissipation stripes exhibit limited heat transfer capability, which can limit the heat dissipation process as discussed above.

In some embodiments, heat dissipation layer 144 may include additional arrays (e.g. layers) of heat dissipation stripes, with every other array of heat dissipation stripes having the same orientation. In alternative embodiments, heat dissipation layer 144 may include additional arrays (e.g. layers) of heat dissipation stripes, with every other array of heat dissipation stripes having a different orientation. Such an arrangement (e.g., a multilayer stripe-type arrangement) however will increase the manufacturing cost and fabrication complexity because it requires a thicker passivation layer and additional photolithography and metallization operations. Additionally, a multilayer stripe-type arrangement will increase the height of stacking device 100.

In some embodiments, stacking device 100 can include two types of heat dissipation layers; for example, mesh-type and stripe-type heat dissipation layers. In some embodiments, where a heat dissipation layer with openings having complex shapes and sizes are required, a stripe-type heat dissipation layer may be preferred over the mesh-type due to the fabrication complexity of mesh-type heat dissipation layers. In other embodiments, mesh-type heat dissipation layers may be preferred over the stripe-type. In some embodiments, within a single chip layer, a combination of mesh-type and stripe-type heat dissipation layers is possible. For example, a first portion of the chip can be covered with a mesh-type heat dissipation layer and a second portion of the chip can be covered with a stripe-type heat passivation layer.

In some embodiments, heat dissipation layers 140, 142, 144, and 200*a/b* include materials with a thermal conductivity greater than about 1 W m$^{-1}$ K$^{-1}$. By way of example and not limitation, heat dissipation layers 140, 142, 144, and 200*a/b* can include cobalt, titanium, tungsten, copper, aluminum, tantalum, titanium nitride, tantalum nitride, gold, silver, another metal, a metal alloy, or combinations thereof. By way of example and not limitation, heat dissipation layer 142, which is integrated to multilevel metallization layer 120, can be thinner than heat dissipation layers 140 and 144, which are embedded in passivation layers 132.

In some embodiments, the heat dissipation layers embedded in a passivation layer (e.g., heat dissipation layers 140 and 144) are positioned between about 0.05 µm and about 20 µm from the nearest substrate (e.g., between about 0.05 µm and about 0.8 µm, between about 0.5 µm and about 4 µm, between about 2 µm and about 10 µm, between about 7 µm and about 14 µm, between about 10 µm and about 17 µm, between about 16 µm and about 20 µm). For example, heat dissipation layer 144 can be positioned between about 0.05 µm and about 20 µm from substrate 110, and heat dissipation layer 140 can be positioned between about 0.05 µm and about 20 µm from substrate 112. This is because heat dissipation layers 140 and 144 are electrically conductive and if they are positioned too close to the substrate (e.g., closer than about 0.05 µm), they can become a leakage path for the semiconductor devices on the chip (e.g., the transistors). On the other hand, if they are positioned too far away from the substrate (e.g., at a distance greater than about 20 µm), the heat dissipation layer will fail to "capture" the heat generated by the chip. For example, the heat generated by the chip will be shielded by the passivation layer disposed between the chip's substrate and the heat dissipation layer.

Heat dissipation layers embedded in a passivation layer, such as heat dissipation layers 140 and 144, can be formed by first forming openings in the passivation layer, and subsequently filling the openings with a conductive material, such as cobalt, titanium, tungsten, copper, aluminum, tantalum, titanium nitride, tantalum nitride, gold, silver, another metal, a metal alloy, or combinations thereof. Openings in the passivation layer can be formed with a combination of photolithography and etching operations. During the photolithography and etching operations, portions of the passivation layer are etched to form the openings in the passivation layer. After the deposition of the conductive material, a planarization process (e.g., a chemical mechanical planarization (CMP) process) polishes (e.g., removes) excess conductive material from a top surface of the passivation layer so that a top surface of the polished conductive material in the heat dissipation layer is substantially coplanar with the top surface of the passivation layer. This operation completes the formation of at least one heat dissipation layer (e.g., heat dissipation layer 140 or heat dissipation stripes 144B). Additional passivation material is then deposited on the heat dissipation layer so that the formed heat dissipation layer becomes embedded in the passivation layer.

If a second heat dissipation layer is desired-like in the case of heat dissipation layer 144—vertical openings are formed in the passivation layer to expose portions of heat dissipation stripes 144B, and a thermally conductive material is deposited in the openings to form thermally conductive structures 146. A CMP process can be used to remove excess thermally conductive material from the top surface of the passivation layer so that a top surface of the polished thermally conductive material in thermally conductive structures 146 is substantially coplanar with a top surface of the passivation layer. Additional passivation material can be deposited on thermally conductive structures 146. Subsequently, photolithography and etching operations can be used to form openings in the deposited passivation material. In other words, the deposited passivation layer is patterned so that heat dissipation stripes 144A can be formed. The openings in the deposited passivation layer also expose the top surface of each thermally conductive structure 146. A conductive material (e.g., cobalt, titanium, tungsten, copper, aluminum, tantalum, titanium nitride, tantalum nitride, gold, silver, another metal, a metal alloy, or combinations thereof) is deposited in the openings and a CMP process polishes (e.g., removes) excess conductive material from a top surface of the passivation layer so that a top surface of the polished conductive material in the heat dissipation layer is substantially coplanar with a top surface of the passivation layer. The CMP operation completes the formation of heat dissipation stripes 144A. Additional passivation material is then deposited on the heat dissipation layer so that heat dissipation stripes 144A become embedded in the passivation layer.

It is noted that the aforementioned formation sequence for dissipation stripes 144A and 144B is not limiting and can be modified by forming, for example, heat dissipation stripes 144A first and heat dissipation stripes 144B second depending on whether heat dissipation layer 144 is formed with chip 102 or on substrate 108. For example, if heat dissipation layer 144 is formed on substrate 108, and subsequently substrate 108 and heat dissipation layer 144 are attached to chip 102, heat dissipation stripes 144B can be formed first and heat dissipation stripes 144A can be formed second. If heat dissipation layer 144 is to be formed with chip 102, chip 102 can be turned upside down (e.g., once multilevel metallization layer 116 of chip 102 is formed) so that heat dissipation layer 144 can be formed on the backside of substrate 108 in a reverse sequence—for example, heat dissipation stripes 144A are formed first followed by heat dissipation stripes 144B using the photolithography, etching, and deposition operations described above.

The operations described above for the formation of heat dissipation layers 144 and 140 are not limiting and alternative operations or "integration schemes" can be used to form heat dissipation layers 144 and 140. These alternative operations or integration schemes are within the spirit and the scope of this disclosure.

In some embodiments, heat dissipation layers 140, 142, and 144 capture the heat generated by respective chips 102, 104, and 106 and subsequently "channel" it vertically (e.g., along the z-axis) towards a central location (e.g., a heat sink) through "dedicated" thermally conductive structures-such as thermally conductive structures in multilevel metallization layers, TOVs, TSVs, bonding structures, or combinations thereof. In some embodiments, the dedicated thermally conductive structures (e.g., represented in a cross hatched pattern in FIG. 1) connected to heat dissipation layers 140, 142, and 144 are not part of the electrical signal distribution network of stacking device 100. In other words, the dedicated thermally conductive structures connected to heat dissipation layers 140, 142, and 144 do not carry current and they are "isolated" from the current carrying structures of stacking device 100 (shaded grey in FIG. 1).

In some embodiments, the thermally conductive structures used for heat routing are similar in shape and size to the electrically conductive structures used throughout stacking device 100. A difference between the two types of structures is their function. For example, the thermally conductive structures (represented in a cross hatched pattern in FIG. 1) "carry" heat, while the electrically conductive structures (shaded gray in FIG. 1) "carry" current. In some embodiments, thermally conductive TOV and/or TSV 148A routes heat from heat dissipation layers 144 and 140 to multilevel thermally conductive structures 150 and 154. In some embodiments, thermally conductive TOV and/or TSV 148A "thermally" connects two or more heat dissipation layers formed in a non-functional area of a chip, like heat dissipation layers 144 and 140, with a multilevel thermally conductive structure like multilevel thermally conductive structure 150 formed in a functional area of a chip. In some embodiments, multilevel thermally conductive structures 150 and 154 include a network of lateral and vertical thermally conductive structures similarly to multilevel metallization layers 118 and 120, which instead include a network of lateral and vertical electrically conductive structures. The number of layers and layout of multilevel thermally conductive structures 150 and 154 shown in FIG. 1 is not limiting and can be tailored based on the chip design and the heat dissipation requirements. For example, multilevel thermally conductive structures 150 and 154 may be formed in locations proximal to a hot spot for efficient heat dissipation. In some embodiments, multilevel thermally conductive structure 150 propagates heat generated from chips 102 and 104 towards thermally conductive bonding structures 152. In some embodiments, thermally conductive bonding structures 152 include hybrid bonding structures—e.g., a combination of dielectric-to-dielectric bonding structures between the passivation layers and metal-to-metal bonding structures between thermally conductive structures 150 and heat dissipation layer 142. Thermally conductive bonding structures 152 are inlaid in the passivation layers of adjacent chips and form a connection point at interface 134 when the chips are bonded together. In some embodiments, thermally conductive bonding structures 152 form a thermal connection between a multilevel thermally conductive structure, like multilevel thermally conductive structure 150 and heat dissipation layer 142. A heat dissipation layer formed in a functional area of a chip, like heat dissipation layer 142, can be connected to a multilevel thermally conductive structure such as multilevel thermally conductive structure 154—which can subsequently transfer heat from heat dissipation layer 142 to solder bump connector 136.

In some embodiments, the thermally conductive structures can include electrically conductive materials with thermal conductivity higher than about 1 W m$^{-1}$ K$^{-1}$. By way of example and not limitation, each of thermally conductive TOV and/or TSV 148A, multilevel thermally conductive structures 150, multilevel thermally conductive structures 154, and thermally conductive bonding structures 152 shown in FIG. 1 can include a thermally conductive material such as cobalt, titanium, tungsten, copper, aluminum, tantalum, titanium nitride, tantalum nitride, gold, silver, another metal, a metal alloy, one or more silicides, or combinations thereof. In some embodiments, electrically conductive structures in stacking device 100 can be "repurposed" to function as thermally conductive structures that route heat between heat dissipation layers 140, 142, and 144. This can be beneficial because there would be no need for specialized thermally conductive structures requiring extended mask modifications or use of separate forming steps or materials. For example, existing electrically conductive networks can be formed with redundant electrically conductive structures integrated to the chip layout to function as thermally conductive structures. However, it is noted that the "re-purposed" electrically conductive structures for the purpose of heat dissipation are electrically isolated from adjacent electrically conductive structures used for electrical signal propagation as discussed above.

Figure 5:
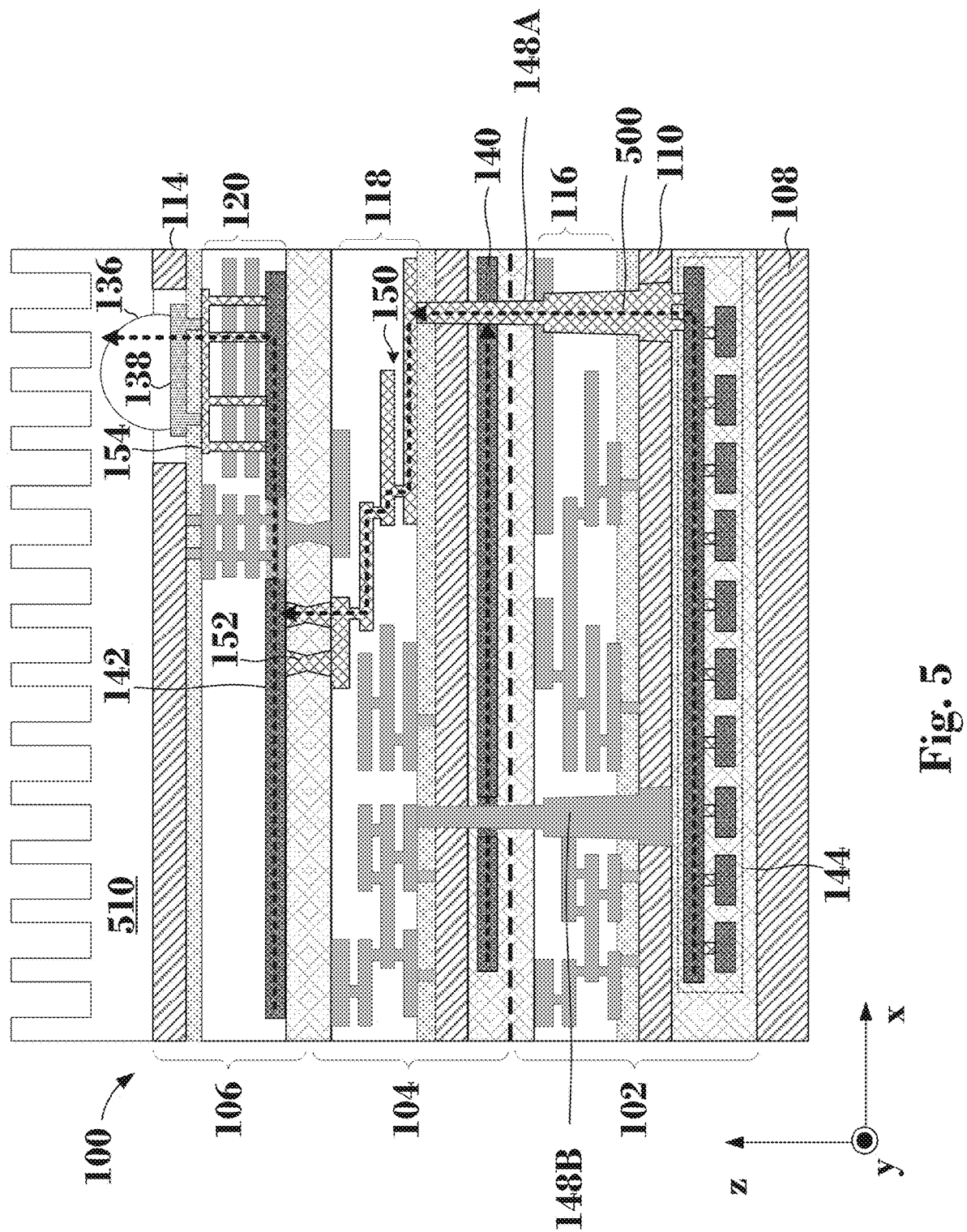
FIG. 5 is heat dissipating route in a cross-sectional view of stacking device with a heat dissipation network, according to some embodiments.

FIG. 5 shows exemplary heat dissipation path 500 described above for stacking device 100. According to some embodiments, heat dissipation path 500 is not limited to the representation of FIG. 5. Rather, alterative combinations and permutations of heat dissipation layers and thermally conductive structures can be used to route heat generated in chips 102, 104, and 106 outside stacking device 100. These combinations of heat dissipation layers and thermally conductive structures are within the spirit and the scope of the disclosure. In some embodiments, heat dissipation occurs along the x-y plane and the heat generated by chips 102, 104, and 106, is collected by respective heat dissipation layers 140, 142, and 144 and is routed through thermally conductive TOV and/or TSV 148A, thermally conductive bonding structures 152, and multilevel thermally conductive structures 150 and 154 to an external heat sink 510 through solder bump connector 136.

In some embodiments, the locations of heat dissipation layers 140, 142, and 144 within stacking device 100 is not limited to the example provided in FIGS. 1, 4, and 5. In other words, heat dissipation layers 140, 142, and 144 can be disposed in alternative locations within stacking device 100. For example, heat dissipation layer 144 can be formed between chips 104 and 102 or between 104 and 106; heat dissipation layer 140 can be formed between chip 102 and substrate 108 or between chip 104 and 106; and heat dissipation layer 142 can be formed in multilevel metallization layers 118 and/or 116; or any combination thereof. Further, stacking device 100 may include additional chips with additional heat dissipation layers (e.g., like heat dissipation layers 140 and 144) therebetween or heat dissipation layers integrated (e.g., like heat dissipation layer 142) to the chips' respective multilevel metallization layers. All the aforementioned combinations and permutations are within the spirit and the scope of this disclosure.

According to some embodiments, FIG. 6 is a flow chart of method 600 which describes the formation of stacking device 100. Other fabrication operations may be performed between the various operations of method 600 and may be omitted merely for clarity. Further, alternative fabrication operations may be performed in place of the operations in method 600. Embodiments of the present disclosure are not limited to method 600. Method 600 will be described with respect to FIGS. 1-5.

Method 600 begins with operation 610 and the process of disposing, on a substrate, a first chip with a first heat dissipation layer connected to a first heat dissipation structure. For example, the first chip of operation 610 can be similar to chip 102 (e.g., shown in FIGS. 1, 4 and 5) which is disposed on carrier substrate 108. Accordingly, the first heat dissipation layer and the first heat dissipation structure can respectively correspond to stripe-type heat dissipation layer 144 and thermally conductive TOV and/or TSV 148A. In some embodiments, the first chip is connected to the substrate via a passivation layer, like passivation layer 132 interposed between chip 102 and substrate 108. Stripe-type heat dissipation layer 144 can be formed in the vicinity of substrate 110 of chip 102 and within passivation layer 132 employing the fabrication operations described earlier.

Referring to FIG. 6, method 600 continues with operation 620 and the process of disposing, on the first chip, a second chip with a second heat dissipation layer and a second heat dissipation structure, where the first heat dissipation structure connects the first heat dissipation layer to the second heat dissipation layer and the second heat dissipation structure. According to some embodiments, the second chip of operation 620 can be similar to chip 104 shown in FIGS. 1, 4, and 5. Similarly, the second heat dissipation layer can correspond to heat dissipation layer 140 and the second heat dissipation structures can correspond to multilevel thermally conductive structures 150. As shown in FIGS. 1, 4, and 5, thermally conductive TOV and/or TSV 148A connects stripe-type heat dissipation layer 144 to heat dissipation layer 140 and to multilevel thermally conductive structures 150. In some embodiments, multilevel thermally conductive structures 150 are connected to stripe-type heat dissipation layer 144 via an array of thermally conductive TOV and/or TSV 148A dispersed throughout chip 102.

In some embodiments, thermally conductive TOV and/or TSV 148A can be formed partially within chip 102 and partially within chip 104. Thus, when chip 104 is disposed on chip 102, respective portions of thermally conductive TOV and/or TSV 148A in the two chips are aligned to form a continuous thermal connection. Further, as discussed above, heat dissipation layer 140 features openings (such as opening B) placed in areas where electrically conductive structures responsible for the electric signal propagation (e.g., electrically conductive TOV and/or TSV 148B) pass through.

Referring to FIG. 6, method 600 continues with operation 630 and the process of disposing, on the second chip, a third chip with a third heat dissipation layer connected to a third heat dissipation structure, where the third heat dissipation layer is connected via heat dissipation bonding structures to the second heat dissipation structure. In some embodiments, the third chip of operation 630 can be similar to chip 106 shown in FIGS. 1, 4, and 5. Accordingly, the third dissipation layer can correspond to heat dissipation layer 142, the third heat dissipation structure can correspond to multilevel thermally conductive structure 154, and heat dissipation bonding structures can correspond to thermally conductive bonding structures 152.

In some embodiments, chip 106 when disposed on chip 104 is oriented 180° with respect chips 102 and 104. In other words, heat dissipation layer 142 can be formed on top of BEOL metallization layers of chip 106 prior to the placement of chip 106 on chip 104. Therefore, as shown in FIGS. 1, 4, and 5, heat dissipation layer 142 appears to be positioned closer to chip 104.

Referring to FIG. 6, method 600 continues with operation 640 and the process of disposing a heat sink on the third chip to connect the heat sink to the third heat dissipation structure. In some embodiments, the heat sink of operation 640 can be similar to heat sink 510 shown in FIG. 5. According to some embodiments, heat sink 510 is connected via solder bump connector 136 to multilevel thermally conductive structure 154 and to all the heat dissipation layers of stacking device 100 as shown in FIG. 5.

Embodiments described herein are directed to heat dissipation structures formed in functional or non-functional areas of the 3D SoIC structures. These heat dissipation structures are configured to efficiently route the heat generated within the 3D SoIC structure to designated areas on the 3D SoIC structure or outside the 3D SoIC structure. In some embodiments, the heat dissipation structures can include (i) heat dissipation layers that extend laterally within a chip in the 3D SoIC structure, (ii) vertical or lateral thermally conductive structures disposed within metallization layers of chip's in the 3D SoIC structure, (iii) vertical thermally conductive structures disposed between two or more chips in the 3D SoIC structure, and/or (iv) combinations thereof. In some embodiments, the heat dissipation layers cover an area equal to or greater than 50% of the chip's surface area and can include more than one layers embedded in a dielectric material, such as a passivation layer or a dielectric layer of a multilevel metallization layer. The heat dissipation layers can include a material with a thermal conductivity greater than about 1 W m$^{-1}$ K$^{-1}$, such as a metal or a metal alloy. Further, the heat dissipation structures can be configured to route heat from different areas of the 3D SoIC structure (e.g., between chips or within chips) to a designated heat dissipation location, such as a heat sink disposed either on the 3D SoIC structure or outside the 3D SoIC structure. According to some embodiments, heat dissipation layers can have a mesh design or a stripped design with vertically stacked arrays of heat passivation stripes at different orientations.

In some embodiments, a structure includes a plurality of chips vertically stacked on a substrate; a first passivation layer interposed between a first chip and a second chip of the plurality of chips; and a heat dissipation layer embedded in the first passivation layer, where the heat dissipation layer is configured to allow conductive structures to pass through.

In some embodiments, a structure includes a plurality of vertically stacked chips bonded together through respective passivation layers. The structure also includes a first heat dissipation layer embedded in a first passivation layer configured to allow conductive structures to pass through, and a second heat dissipation layer embedded in a second passivation layer, where the second heat dissipation layer includes a first array of heat dissipating stripes disposed on a second array of heat dissipating stripes. The structure further includes a third heat dissipation layer disposed in a metallization layer of one of the vertically stacked chips.

In some embodiments, a stacked structure includes a first chip, a second chip, and a third chip vertically stacked on a substrate, where the second chip is interposed between the first and second chip. The stacked structure further includes a first heat dissipation layer embedded in a passivation layer disposed between the first and second chips, and where the first heat dissipation layer includes stacked layers of heat dissipating stripes. Additionally, the stacked structure includes a second heat dissipation layer integrated in the third chip and configured to allow conductive structures of the third chip to pass through.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate;
   a first dielectric layer disposed on the substrate;
   a second dielectric layer disposed on the first dielectric layer;
   a heat dissipation layer disposed in the second dielectric layer;
   an electrically conductive structure disposed in the first and second dielectric layers and isolated from the heat dissipation layer; and
   a thermally conductive structure disposed in the first and second dielectric layers and coupled to the heat dissipation layer.

2. The structure of claim 1, wherein a portion of the thermally conductive structure is disposed in the substrate.

3. The structure of claim 1, wherein the thermally conductive structure extends vertically through the substrate and the first and second dielectric layers.

4. The structure of claim 1, wherein the thermally conductive structure comprises:
   a first portion with a first width disposed in the first dielectric layer; and
   a second portion with a second width disposed in the second dielectric layer, wherein the second width is smaller than the first width.

5. The structure of claim 1, wherein the heat dissipation layer comprises an opening, and wherein the electrically conductive structure extends vertically through the opening.

6. The structure of claim 1, further comprising:
   a third dielectric layer disposed on the second dielectric layer; and
   a multi-level thermally conductive structure disposed in the third dielectric layer and coupled to the thermally conductive structure.

7. The structure of claim 1, further comprising:
   a third dielectric layer disposed on the second dielectric layer; and
   a multi-level electrically conductive structure disposed in the third dielectric layer and coupled to the electrically conductive structure.

8. The structure of claim 1, further comprising:
   a third dielectric layer disposed on the second dielectric layer;
   an other heat dissipation layer disposed in the third dielectric layer; and
   a multi-level electrically conductive structure disposed in the third dielectric layer and isolated from the other heat dissipation layer.

9. The structure of claim 1, further comprising:
   a third dielectric layer disposed under the second dielectric layer; and
   an other heat dissipation layer disposed in the third dielectric layer and coupled to the thermally conductive structure, wherein the other heat dissipation layer comprises:
      a first array of heat dissipation stripes aligned along a first direction; and
      a second array of heat dissipation stripes disposed on the first array of heat dissipation stripes and aligned along a second direction different from the first direction.

10. The structure of claim 1, further comprising a heat sink disposed on the second dielectric layer and coupled to the thermally conductive structure.

11. A structure, comprising:
   a substrate;
   a first metallization layer comprising a first metal line disposed on the substrate;
   a second metallization layer comprising a second metal line disposed on the first metallization layer;
   a dielectric layer disposed between the first and second metallization layers;
   first and second through-vias extending vertically through the substrate, the first metallization layer, and the dielectric layer; and
   a thermally conductive line disposed in the dielectric layer and surrounding the first and second through-vias, wherein the thermally conductive line is electrically isolated from the first through-via and is in contact with the second through-via.

12. The structure of claim 11, wherein the first through-via is electrically coupled to the first and second metal lines.

13. The structure of claim 11, wherein the second metallization layer further comprises an other thermally conductive line coupled to a top surface of the second through-via.

14. The structure of claim 11, further comprising:
   a first array of thermally conductive lines coupled to the second through-via and aligned along a first direction; and
   a second array of thermally conductive lines coupled to the first array of thermally conductive lines and aligned along a second direction different from the first direction.

15. The structure of claim 11, further comprising a heat sink disposed on the second metallization layer and configured to receive heat from the first metallization layer through the second through-via.

16. The structure of claim 11, wherein top surfaces of the first and second through-vias are substantially coplanar with each other.

17. A method, comprising:
   forming a metallization layer on a first side of a substrate;
   depositing a first dielectric layer on a second side of the substrate;
   depositing a first thermally conductive layer in an opening in the first dielectric layer;
   depositing a second thermally conductive layer on the first thermally conductive layer;
   depositing a second dielectric layer on the second thermally conductive layer; and
   forming a thermally conductive via through the first dielectric layer, the substrate, and the metallization layer.

18. The method of claim 17, wherein forming the second thermally conductive layer comprises forming the second thermally conductive layer with elongated sides substantially perpendicular to elongated sides of the first thermally conductive layer.

19. The method of claim 17, further comprising etching the first dielectric layer to form the opening.

20. The method of claim 17, further comprising forming a third thermally conductive layer surrounding the thermally conductive via.

* * * * *